(12) United States Patent
Ganguli et al.

(10) Patent No.: US 7,186,385 B2
(45) Date of Patent: Mar. 6, 2007

(54) APPARATUS FOR PROVIDING GAS TO A PROCESSING CHAMBER

(75) Inventors: Seshadri Ganguli, Sunnyvale, CA (US); Ling Chen, Sunnyvale, CA (US); Vincent W. Ku, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 478 days.

(21) Appl. No.: 10/198,727

(22) Filed: Jul. 17, 2002

(65) Prior Publication Data

US 2004/0013577 A1    Jan. 22, 2004

(51) Int. Cl.
A01G 13/06    (2006.01)
B01D 7/00     (2006.01)
C23C 14/00    (2006.01)
F24F 3/14     (2006.01)
A61M 16/00    (2006.01)

(52) U.S. Cl. .................. 422/129; 392/386; 392/388; 392/389; 392/390

(58) Field of Classification Search ................ 438/680; 427/446, 248.1; 422/29; 239/1; 118/728; 34/586
See application file for complete search history.

(56) References Cited

U.S. PATENT DOCUMENTS

| | | | |
|---|---|---|---|
| 4,817,557 A | 4/1989 | Diem et al. | 118/719 |
| 5,188,808 A * | 2/1993 | Lilja et al. | 422/229 |
| 5,225,251 A | 7/1993 | Esrom | 427/552 |
| 5,377,429 A * | 1/1995 | Sandhu et al. | 34/586 |
| 5,381,605 A | 1/1995 | Krafft | 34/408 |
| 5,674,574 A | 10/1997 | Atwell et al. | 427/561 |
| 6,015,595 A | 1/2000 | Felts | 427/446 |
| 6,077,396 A * | 6/2000 | LaRiviere | 162/243 |
| 6,107,198 A | 8/2000 | Lin et al. | 438/680 |
| 6,248,434 B1 | 6/2001 | Rödiger et al. | 428/307.7 |
| 6,328,221 B1 * | 12/2001 | Moore et al. | 239/1 |
| 6,718,126 B2 * | 4/2004 | Lei | 392/388 |
| 6,730,267 B2 * | 5/2004 | Stringer et al. | 422/45 |
| 6,866,951 B2 * | 3/2005 | Foley et al. | 429/17 |
| 2001/0003603 A1 | 6/2001 | Eguchi et al. | 427/248.1 |
| 2002/0009544 A1 | 1/2002 | McFeely et al. | 427/248.1 |
| 2003/0042630 A1* | 3/2003 | Babcoke et al. | 261/121.1 |
| 2003/0053799 A1 | 3/2003 | Lei | 392/388 |
| 2003/0082307 A1 | 5/2003 | Chung et al. | |

FOREIGN PATENT DOCUMENTS

EP    1 079 001    2/2001

(Continued)

OTHER PUBLICATIONS

Ravetz, et al., "Properties of Solution TMI™ as an OMVPE Source," J. Electron. Mater. (USA) vol. 29, No. 1, p. 156-60, Jan. 2000.

(Continued)

Primary Examiner—Alexa Neckel
Assistant Examiner—Kaity Handal
(74) Attorney, Agent, or Firm—Patterson & Sheridan LLP (57) ABSTRACT

An apparatus for generating gas for a processing system is provided. In one embodiment, an apparatus for generating gas for a processing system includes a canister having at least one baffle disposed between two ports and containing a precursor material. The precursor material is adapted to produce a gas vapor when heated to a defined temperature at a defined pressure. The baffle forces a carrier gas to travel an extended mean path between the inlet and outlet ports. In another embodiment, an apparatus for generating gas includes a canister having a tube that directs a carrier gas flowing into the canister away from a precursor material disposed within the canister.

38 Claims, 4 Drawing Sheets

FOREIGN PATENT DOCUMENTS

| | | |
|---|---|---|
| GB | 2 151 662 | 7/1985 |
| GB | 2 223 509 A | 4/1990 |
| JP | 56035426 | 4/1981 |

OTHER PUBLICATIONS

Hartje, et al., "CVD reactor source—has irradiated surface to vaporize surface of reaction component held solid by internal cooling," Patent No. DD 274057, Dec. 6, 1989, AKAD Wissenschaften DDR, Derwent WPI File, Record No. 008261396, Abstract.

NEC Corp, "Gasifier for sublimation for CVD unit—has container for solid material, $1^{st}$ heater, $2^{nd}$ heater to heat gas trapped by mesh structure, etc.," Patent No. 5-214537, Aug. 24, 1993, Derwent WPI File, Record No. 009606474, Abstract.

PCT Search Report for PCT/US03/22186 dated Apr. 14, 2004.

Partial International Search Report from International Application No. PCT/US03/22186.

PCT International Preliminary Report on Patentability, Written Opinion of the International Searching Authority, Mail Date Dec. 15, 2005 (PCT/US2004/016715).

* cited by examiner

APPARATUS FOR PROVIDING GAS TO A PROCESSING CHAMBER

BACKGROUND OF THE INVENTION

1. Field of the Invention

Embodiments of the invention generally relate to a method and apparatus for providing gas to a processing chamber.

2. Background of the Related Art

Integrated circuits have evolved into complex devices that can include millions of transistors, capacitors and resistors on a single chip. The evolution of chip design continually requires faster circuitry and greater circuit density demanding increasingly precise fabrication processes. The precision processing of substrates requires precise control of temperature, rate and pressure in the delivery of fluids used during processing. The control of these fluids is typically facilitated using a gas panel that contains various valves, regulators, flow controllers and the like.

Fluids used during processing are provided to the gas panel and liquid or gas is formed from a central gas source or a supply vessel positioned proximate the panel. Some process gases may be generated at or near the gas panel from a solid material through a sublimation process. Sublimation is generally a process through which a gas is produced directly from a solid at a certain pressure and temperature without passing through a liquid state. Some gases that may be produced through a sublimation process include xenon difluoride, nickel carbonyl, tungsten hexa-carbonyl, and pentakis (dimethylamino) tantalum (PDMAT) among others. As these materials tend to be very active and expensive, careful control of the sublimation process is required in order to manage the generation of the sublimed solid without undue waste.

A conventional sublimation process is typically performed in a heated vessel loaded or filled with a solid precursor material to be sublimed. As gas is needed, the vessel walls and/or tray supporting the solid precursor material are heated and the gas is produced.

An alternative gas generation process includes mixing a solid or liquid precursor material with a liquid. A carrier gas is then bubbled through the mixture to carry the generated process gas.

However, as the carrier gas is bubbled through or impacted against either a solid precursor or liquid/solid mixture, particulates from the solid precursor and or liquid may become entrained in the carrier gas and transferred into the process chamber. Liquid or solid particulates may become a source of chamber or substrate contamination. Thus, reduction of particulates passing from precursor gas generator into a processing chamber would serve at least two purposes. First, such a reduction in particulates would reduce substrate defects. Second, a reduction in particulates would reduce the downtime required for cleaning the contaminated chamber surfaces.

Therefore, there is a need for an improved method and apparatus for providing a precursor gas to a processing chamber.

SUMMARY OF THE INVENTION

One aspect of the present invention generally provides an apparatus for generating gas for a processing system. In one embodiment, the apparatus for generating gas for a processing system includes a canister containing a precursor material. The canister includes a top, a bottom, and a sidewall defining an interior volume. The interior volume has an upper region and a lower region, wherein the lower region is at least partially filled by the precursor material. An inlet port and an outlet port are formed through the canister and are in communication with the upper region. At least one baffle is disposed within the upper region of the canister between the inlet and outlet port.

In another aspect of the invention, a method for generating gas for a processing system is provided. In one embodiment, the method for generating gas includes the steps of providing a precursor material contained in the lower region of the canister, flowing a carrier gas from the inlet port through the upper region of the canister along an extended mean path to the outlet port, and heating the precursor material to generate a process gas.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
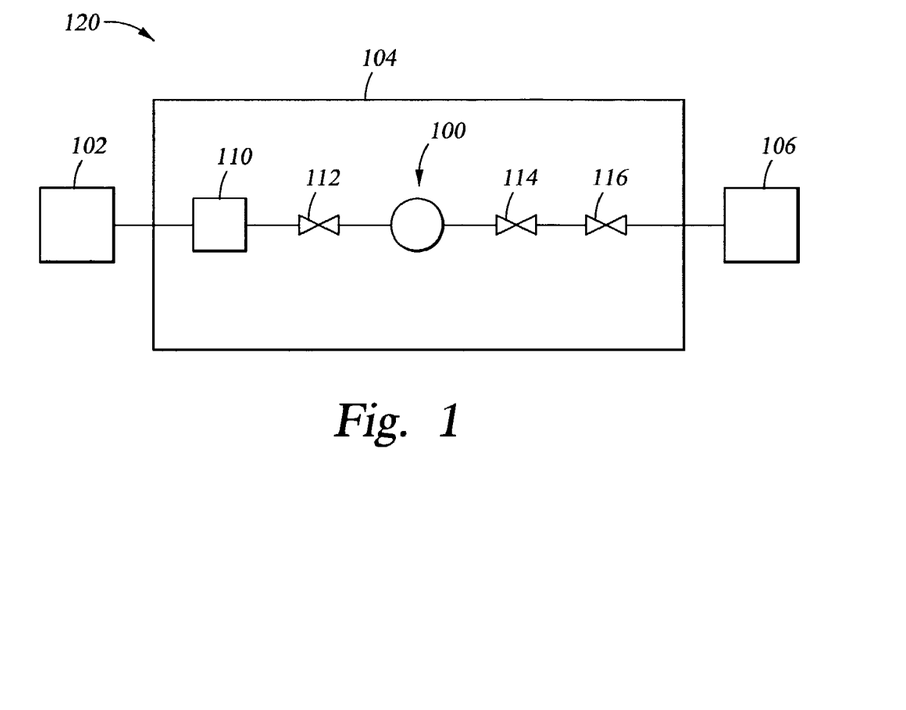
FIG. 1 is a simplified schematic view of a processing system having one embodiment of a gas generation system.

FIG. 1 generally depicts a simplified schematic of a semiconductor wafer processing system 120. The processing system 120 generally includes a processing chamber 106 coupled to a gas delivery system 104. The processing chamber 106 may be any suitable processing chamber, for example, those available from Applied Materials, Inc. located in Santa Clara, Calif. Exemplary processing chambers include DPS CENTURA® etch chambers, PRODUCER® chemical vapor deposition chambers, and ENDURA® physical vapor deposition chambers, among others.

The gas delivery system 104 generally controls the rate and pressure at which various process and inert gases are delivered to the processing chamber 106. The number and types of process and other gases delivered to the processing chamber 106 are generally selected based on the process to be performed in the processing chamber 106 coupled thereto. Although for simplicity a single gas delivery circuit is depicted in the gas delivery system 104 shown in FIG. 1, it is contemplated that additional gas delivery circuits may be utilized.

The gas delivery system 104 is generally coupled between a carrier gas source 102 and the processing chamber 106. The carrier gas source 102 may be a local or remote vessel or a centralized facility source that supplies the carrier gas throughout the facility. The carrier gas source 102 typically supplies a carrier gas such as argon, nitrogen, helium or other inert or non-reactive gas.

The gas delivery system 104 typically includes a flow controller 110 coupled between the carrier gas source 102 and a process gas source canister 100. The flow controller 110 may be a proportional valve, modulating valve, needle valve, regulator, mass flow controller or the like. One flow controller 110 that may be utilized is available from Sierra Instruments, Inc., located in Monterey, Calif.

The source canister 100 is typically coupled to and located between a first and a second valve 112, 114. In one embodiment, the first and second valves 112, 114 are coupled to the canister 100 and fitted with disconnect fittings (not shown) to facilitate removal of the valves 112, 114 with the canister 100 from the gas delivery system 104. A third valve 116 is disposed between the second valve 114 and the processing chamber 106 to prevent introduction of contaminates into the processing chamber 106 after removal of the canister 100 from the gas delivery system 104.

Figure 2A:
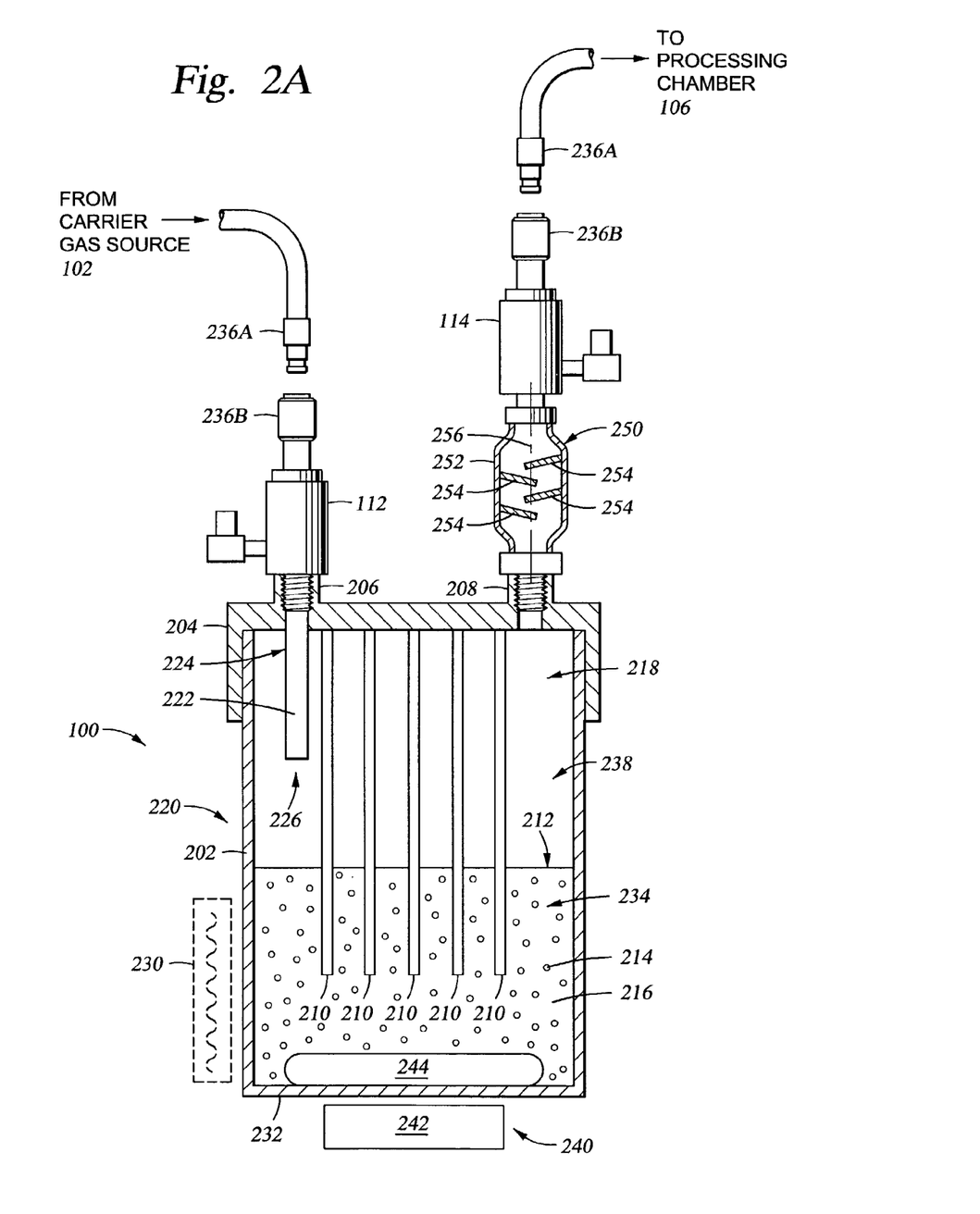
FIG. 2A is a sectional side view of one embodiment of a gas generation canister.
Figure 2B:
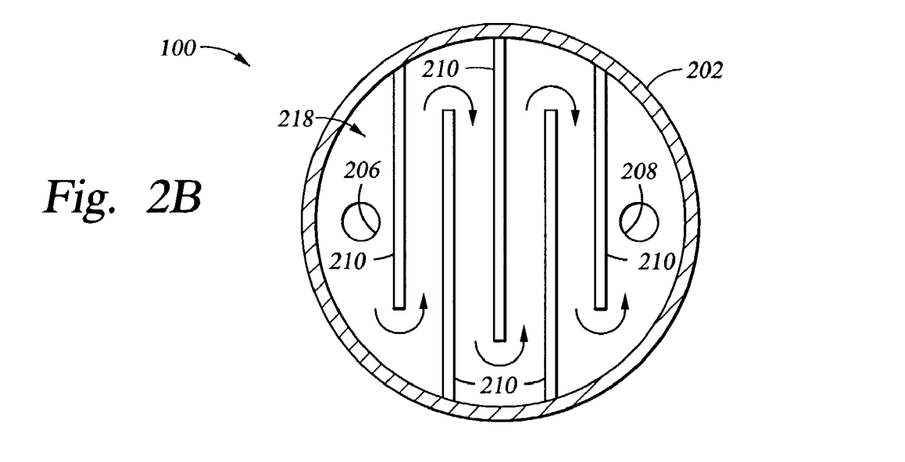
FIG. 2B is a sectional top view of one embodiment of a gas generation canister.

FIGS. 2A and 2B depict sectional views of one embodiment of the canister 100. The canister 100 generally comprises an ampoule or other sealed container having a housing 220 that is adapted to hold precursor materials 214 from which a process (or other) gas may be generated through a sublimation or vaporization process. Some solid precursor materials 214 that may generate a process gas in the canister 100 through a sublimation process include xenon difluoride, nickel carbonyl, tungsten hexa-carbonyl, and pentakis (dimethylamino) tantalum (PDMAT), among others. Some liquid precursor materials 214 that may generate a process gas in the canister 100 through a vaporization process include tetrakis (dimethylamino) titanium (TDMAT), tertbutyliminotris (diethylamino) tantalum (TBTDET), and pentakis (ethylmethylamino) tantalum (PEMAT), among others. The housing 220 is generally fabricated from a material substantially inert to the precursor materials 214 and gas produced therefrom, and thus, the material of construction may vary based on gas being produced. In one embodiment, tungsten hexa-carbonyl is generated within the canister 100 and the housing 220 is fabricated from a material substantially inert to tungsten hexa-carbonyl, for example, stainless steel, aluminum, PFA, or other suitable non-organic material.

The housing 220 may have any number of geometric forms. In the embodiment depicted in FIGS. 2A and 2B, the housing 220 comprises a cylindrical sidewall 202 and a bottom 232 sealed by a lid 204. The lid 204 may be coupled to the sidewall 202 by welding, bonding, adhesives, or other leak-tight method. Alternately, the joint between the sidewall 202 and the lid 204 may have a seal, o-ring, gasket, or the like, disposed therebetween to prevent leakage from the canister 100. The sidewall 202 may alternatively comprise other hollow geometric forms, for example, a hollow square tube.

An inlet port 206 and an outlet port 208 are formed through the canister to allow gas flow into and out of the canister 100. The ports 206, 208 may be formed through the lid 204 and/or sidewall 202 of the canister 100. The ports 206, 208 are generally sealable to allow the interior of the canister 100 to be isolated from the surrounding environment during removal of the canister 100 from the gas delivery system 104. In one embodiment, valves 112, 114 are sealingly coupled to ports 206, 208 to prevent leakage from the canister 100 when removed from the gas delivery system 104 (shown in FIG. 1) for recharging of the precursor material 214 or replacement of the canister 100. Mating disconnect fittings 236A, 236B may be coupled to valves 112, 114 to facilitate removal and replacement of the canister 100 to and from the gas delivery system 104. Valves 112, 114 are typically ball valves or other positive sealing valves that allows the canister 100 to be removed from the system efficiently loaded and recycled while minimizing potential leakage from the canister 100 during filling, transport, or coupling to the gas delivery system 104. Alternatively, the canister 100 can be refilled through a refill port (not shown) such as a small tube with a VCR fitting disposed on the lid 204 of the canister 100.

The canister 100 has an interior volume 238 having an upper region 218 and a lower region 234. The lower region 234 of canister 100 is at least partially filled with the precursor materials 214. Alternately, a liquid 216 may be added to a solid precursor material 214 to form a slurry 212. The precursor materials 214, the liquid 216, or the premixed slurry 212 may be introduced into canister 100 by removing the lid 204 or through one of the ports 206, 208. The liquid 216 is selected such that it is non-reactive with the precursor materials 214, that the precursor materials 214 are insoluble therein, and that the liquid 216 has a negligible vapor pressure compared to the precursor materials 214. For example, a liquid 216 added to a solid precursor material 214 such as tungsten hexa-carbonyl should have a higher vapor pressure than the tungsten hexa-carbonyl by greater than about $1 \times 10^3$ Torr to ensure that the sublimating vapor comprises mainly tungsten hexa-carbonyl and only a negligible quantity of liquid.

Precursor materials 214 mixed with the liquid 216 may be sporadically agitated to keep the precursor materials 214 suspended in the liquid 216 in the slurry 212. In one embodiment, precursor materials 214 and the liquid 216 are agitated by a magnetic stirrer 240. The magnetic stirrer 240 includes a magnetic motor 242 disposed beneath the bottom 232 of the canister 100 and a magnetic pill 244 disposed in the lower region 234 of the canister 100. The magnetic motor 242 operates to rotate the magnetic pill 244 within the canister 100, thereby mixing the slurry 212. The magnetic pill 244 should have an outer coating of material that is a non-reactive with the precursor materials 214, the liquid 216, or the canister 100. Suitable magnetic mixers are commercially available. One example of a suitable magnetic mixer is IKAMAG® REO available from IKA® Works in Wilmington, N.C. Alternatively, the slurry 212 may be agitated other means, such as by a mixer, a bubbler, or the like.

The agitation of the liquid 216 may induce droplets of the liquid 216 to become entrained in the carrier gas and carried toward the processing chamber 106. To prevent such droplets of liquid 216 from reaching the processing chamber 106, an oil trap 250 may optionally be coupled to the exit port 208 of the canister 100. The oil trap 250 includes a body 252 containing a plurality of interleaved baffles 254 which extend past a centerline 256 of the oil trap body 252 and are angled at least slightly downward towards the canister 100. The baffles 254 force the gas flowing towards the processing chamber 106 to flow a tortuous path around the baffles 254. The surface area of the baffles 254 provides a large surface area exposed to the flowing gas to which oil droplets that may be entrained in the gas adhere to. The downward angle of the baffles 254 allows any oil accumulated in the oil trap to flow downward and back into the canister 100.

The canister 100 includes at least one baffle 210 disposed within the upper region 218 of the canister 100. The baffle 210 is disposed between inlet port 206 and outlet port 208, creating an extended mean flow path, thereby preventing direct (i.e., straight line) flow of the carrier gas from the inlet port 206 to the outlet port 208. This has the effect of increasing the mean dwell time of the carrier gas in the canister 100 and increasing the quantity of sublimated or vaporized precursor gas carried by the carrier gas. Additionally, the baffles 210 direct the carrier gas over the entire exposed surface of the precursor material 214 disposed in the canister 100, ensuring repeatable gas generation characteristics and efficient consumption of the precursor materials 214.

The number, spacing and shape of the baffles 210 may be selected to tune the canister 100 for optimum generation of precursor gas. For example, a greater number of baffles 210 may be selected to impart higher carrier gas velocities at the precursor material 214 or the shape of the baffles 210 may be configured to control the consumption of the precursor material 214 for more efficient usage of the precursor material.

The baffle 210 may be attached to the sidewall 202 or the lid 204, or the baffle 210 may be a prefabricated insert designed to fit within the canister 100. In one embodiment, the baffles 210 disposed in the canister 100 comprise five rectangular plates fabricated of the same material as the sidewall 202. Referring to FIG. 2B, the baffles 210 are welded or otherwise fastened to the sidewall 202 parallel to each other. The baffles 210 are interleaved, fastened to opposing sides of the canister in an alternating fashion, such that a serpentine extended mean flow path is created. Furthermore, the baffles 210 are situated between the inlet port 206 and the outlet port 208 on the lid 204 when placed on the sidewall 202 and are disposed such that there is no air space between the baffles 210 and the lid 204. The baffles 210 additionally extend at least partially into the lower region 234 of the canister 100, thus defining an extended mean flow path for the carrier gas flowing through the upper region 218.

Optionally, an inlet tube 222 may be disposed in the interior volume 238 of the canister 100. The tube 222 is coupled by a first end 224 to the inlet port 206 of the canister 100 and terminates at a second end 226 in the upper region 218 of the canister 100. The tube 222 injects the carrier gas into the upper region 218 of the canister 100 at a location closer to the precursor materials 214 or the slurry 212.

The precursor materials 214 generate a precursor gas at a predefined temperature and pressure. Sublimating or vaporized gas from the precursor materials 214 accumulate in the upper region 218 of the canister 100 and are swept out by an inert carrier gas entering through inlet port 206 and exiting outlet port 208 to be carried to the processing chamber 106. In one embodiment, the precursor materials 214 are heated to a predefined temperature by a resistive heater 230 disposed proximate to the sidewall 202. Alternately, the precursor materials 214 may be heated by other means, such as by a cartridge heater (not shown) disposed in the upper region 218 or the lower region 234 of the canister 100 or by preheating the carrier gas with a heater (not shown) placed upstream of the carrier gas inlet port 206. To maximize uniform heat distribution throughout the slurry 212, the liquid 216 and the baffles 210 should be good conductors of heat.

In one exemplary mode of operation, the lower region 234 of the canister 100 is at least partially filled with a mixture of tungsten hexa-carbonyl and diffusion pump oil to form the slurry 212. The slurry 212 is held at a pressure of about 5 Torr and is heated to a temperature in the range of about 40 to about 50 degrees Celsius by a resistive heater 230 located proximate to the canister 100. Carrier gas in the form of argon is flowed through inlet port 206 into the upper region 218 at a rate of about 200 standard cc/min. The argon flows in an extended mean flow path defined by the tortuous path through the baffles 210 before exiting the canister 100 through outlet port 208, advantageously increasing the mean dwell time of the argon in the upper region 218 of the canister 100. The increased dwell time in the canister 100 advantageously increases the saturation level of sublimated tungsten hexa-carbonyl vapors within the carrier gas. Moreover, the tortuous path through the baffles 210 advantageously exposes the substantially all of the exposed surface area of the precursor material 214 to the carrier gas flow for uniform consumption of the precursor material 214 and generation of the precursor gas.

Figure 3:
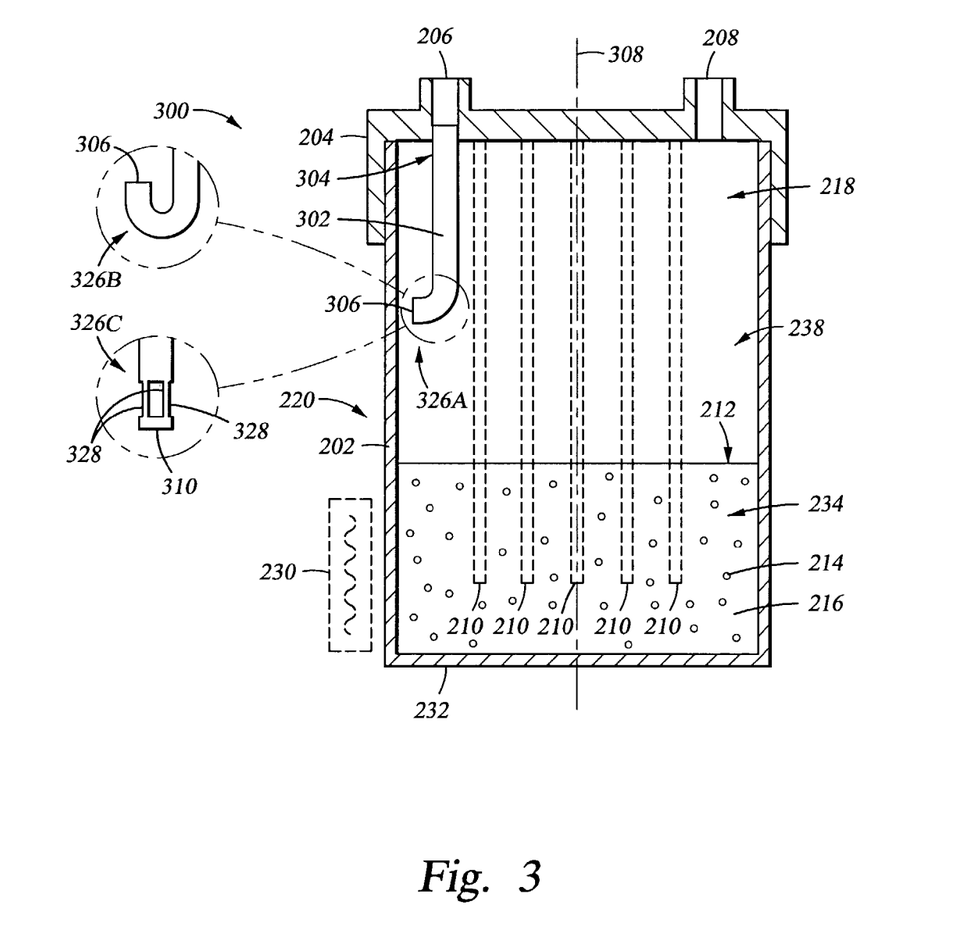
FIG. 3 is a sectional view of another embodiment of a gas generation canister.

FIG. 3 depicts a sectional view of another embodiment of a canister 300 for generating a process gas. The canister includes a sidewall 202, a lid 204 and a bottom 232 enclosing an interior volume 238. At least one of the lid 204 or sidewall 202 contains an inlet port 206 and an outlet port 208 for gas entry and egress. The interior volume 238 of the canister 300 is split into an upper region 218 and a lower region 234. Precursor materials 214 at least partially fill the lower region 234. The precursor materials 214 may be in the form of a solid, liquid or slurry, and are adapted to generate a process gas by sublimation and/or vaporization.

A tube 302 is disposed in the interior volume 238 of the canister 300 and is adapted to direct a flow of gas within the canister 300 away from the precursor materials 214, advantageously preventing gas flowing out of the tube 302 from directly impinging the precursor materials 214 and causing particulates to become airborne and carried through the outlet port 208 and into the processing chamber 106. The tube 302 is coupled at a first end 304 to the inlet port 206. The tube 302 extends from the first end 304 to a second end 326A that is positioned in the upper region 218 above the precursor materials 214. The second end 326A may be adapted to direct the flow of gas toward the sidewall 202, thus preventing direct (linear or line of sight) flow of the gas through the canister 300 between the ports 206, 208, creating an extended mean flow path.

In one embodiment, an outlet 306 of the second end 326A of the tube 302 is oriented an angle of about 15 to about 90 degrees relative to a center axis 308 of the canister 300. In another embodiment, the tube 302 has a 'J'-shaped second end 326B that directs the flow of gas exiting the outlet 306 towards the lid 204 of the canister 300. In another embodiment, the tube 302 has a second end 326C having a plug or cap 310 closing the end of the tube 302. The second end 326C has at least one opening 328 formed in the side of the tube 302 proximate the cap 310. Gas, exiting the openings 328, is typically directed perpendicular to the center axis 308 and away from the precursor materials 214 disposed in the lower region 234 of the canister 300. Optionally, an at least one baffle 210 (shown in phantom) as described above may be disposed within the chamber 300 and utilized in tandem with any of the embodiments of the tube 302 described above.

In one exemplary mode of operation, the lower region 234 of the canister 300 is at least partially filled with a mixture of tungsten hexa-carbonyl and diffusion pump oil to form the slurry 212. The slurry 212 is held at a pressure of about 5 Torr and is heated to a temperature in the range of about 40 to about 50 degrees Celsius by a resistive heater 230 located proximate to the canister 300. A carrier gas in the form of argon is flowed through the inlet port 206 and the tube 302 into the upper region 218 at a rate of about 200 standard cc/min. The second end 326A of the tube 302 directs the flow of the carrier gas in an extended mean flow path away from the outlet port 208, advantageously increasing the mean dwell time of the argon in the upper region 218 of the canister 300 and preventing direct flow of carrier gas upon the precursor materials 214 to minimize particulate generation. The increased dwell time in the canister 300 advantageously increases the saturation level of sublimated tungsten hexa-carbonyl gas within the carrier gas while the decrease in particulate generation improves product yields, conserves source solids, and reduces downstream contamination.

Figure 4:
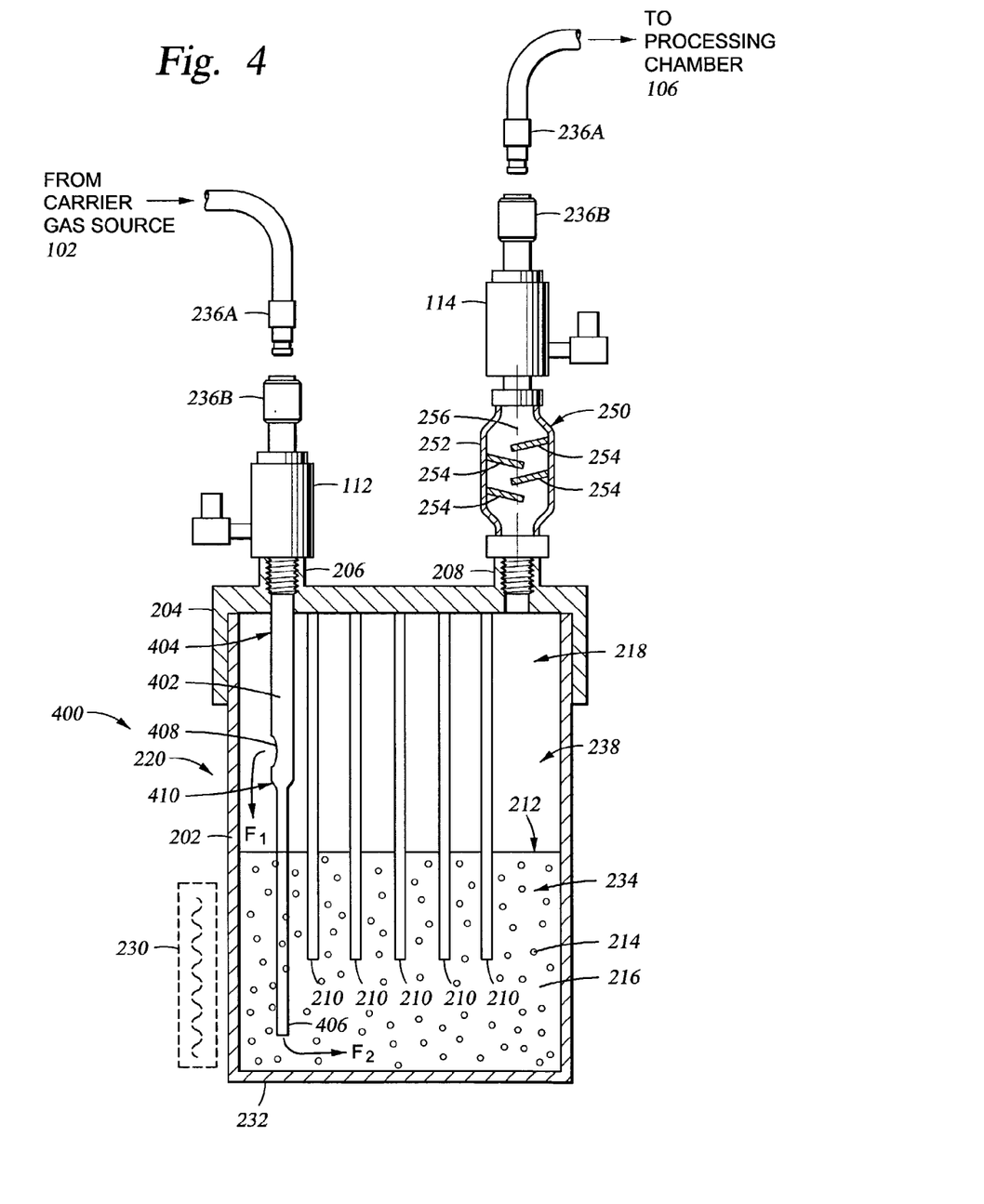
FIG. 4 is a sectional side view of another embodiment of a gas generation canister.

FIG. 4 depicts a sectional view of another embodiment of a canister 400 for generating a precursor gas. The canister 400 includes a sidewall 202, a lid 204 and a bottom 232 enclosing an interior volume 238. At least one of the lid 204 or sidewall 202 contains an inlet port 206 and an outlet port 208 for gas entry and egress. Inlet and outlet ports 206, 208 are coupled to valves 112, 114 fitted with mating disconnect fittings 236A, 236B to facilitate removal of the canister 400 from the gas delivery system 104. Optionally, an oil trap 250 is coupled between the outlet port 208 and the valve 114 to capture any oil particulate that may be present in the gas flowing to the process chamber 106.

The interior volume 238 of the canister 300 is split into an upper region 218 and a lower region 234. Precursor materials 214 and a liquid 216 at least partially fill the lower region 234. A tube 402 is disposed in the interior volume 238 of the canister 400 and is adapted to direct a first gas flow $F_1$ within the canister 400 away from the precursor material and liquid mixture and to direct a second gas flow $F_2$ through the mixture. The flow $F_1$ is much greater than the flow $F_2$. The flow $F_2$ is configured to act as a bubbler, being great enough to agitate the precursor material and liquid mixture but not enough to cause particles or droplets of the precursor materials 214 or liquid 216 from becoming airborne. Thus, this embodiment advantageously agitates the precursor material and liquid mixture while minimizing particulates produced due to direct impingement of the gas flowing out of the tube 402 on the precursor materials 214 from becoming airborne and carried through the outlet port 208 and into the processing chamber 106.

The tube 402 is coupled at a first end 404 to the inlet port 206. The tube 402 extends from the first end 404 to a second end 406 that is positioned in the lower region 234 of the canister 400, within the precursor material and liquid mixture. The tube 402 has an opening 408 disposed in the upper region 218 of the canister 400 that directs the first gas flow $F_1$ towards a sidewall 202 of the canister 400. The tube 400 has a restriction 410 disposed in the upper region 238 of the canister 400 located below the opening 408. The restriction 410 serves to decrease the second gas flow $F_2$ flowing toward the second end 406 of the tube 402 and into the slurry 212. By adjusting the amount of the restriction, the relative rates of the first and second gas flows $F_1$ and $F_2$ can be regulated. This regulation serves at least two purposes. First, the second gas flow $F_2$ can be minimized to provide just enough agitation to maintain suspension or mixing of the precursor materials 214 in the liquid 216 while minimizing particulate generation and potential contamination of the processing chamber 106. Second, the first gas flow $F_1$ can be regulated to maintain the overall flow volume necessary to provide the required quantity of sublimated and/or vapors from the precursor materials 214 to the processing chamber 106.

Optionally, an at least one baffle 210 (shown in phantom) as described above may be disposed within the chamber 400 and utilized in tandem with any of the embodiments of the tube 402 described above.

While the foregoing is directed to the preferred embodiment of the present invention, other and further embodiments of the invention may be devised without departing from the basic scope thereof. The scope of the invention is determined by the claims that follow.

What is claimed is:

1. Apparatus for generating gas for a semiconductor processing system, comprising:
a canister having a sidewall, a top and a bottom defining an interior volume, the interior volume having an upper region and a lower region;
an inlet port and an outlet port formed through the top of the canister and in communication with the upper region;
at least one baffle disposed within the upper region of the canister and creating a tortuous flow path between the inlet port and the outlet port; and
a precursor material at least partially filling the lower region of the canister.

2. The apparatus of claim 1, further comprising:
a first valve coupled to the inlet port; and
a second valve coupled to the outlet port.

3. The apparatus of claim 1, further comprising a tube having a first end coupled to the inlet port and a second end terminating in the upper region of the canister.

4. The apparatus of claim 3, wherein the second end is angled from about 15 degrees to about 90 degrees relative to an axis of the canister.

5. The apparatus of claim 1, further comprising a liquid intermixed with the precursor material and forming a slurry, wherein the liquid is non-reactive with the precursor material, has a negligible vapor pressure relative to the precursor material, and the precursor material is insoluble therein.

6. The apparatus of claim 5, wherein the precursor material is tungsten hexacarbonyl and the liquid is diffusion pump oil.

7. The apparatus of claim 5, further comprising means for agitating the slurry.

8. The apparatus of claim 7, wherein the means for agitating is selected from the group consisting of a magnetic stirrer, a mixer, and a bubbler.

9. The apparatus of claim 1, wherein the precursor material is selected from the group consisting of xenon difluoride, nickel carbonyl, tungsten hexacarbonyl, and pentakis (dimethylamido) tantalum.

10. The apparatus of claim 1 further comprising an oil trap coupled to the outlet port.

11. The apparatus of claim 1, wherein the at least one baffle is a plurality of interleaved baffles.

12. The apparatus of claim 11, wherein the plurality of baffles extends at least partially into the lower region of the canister.

13. The apparatus of claim 1, further comprising a means for heating the precursor material.

14. The apparatus of claim 13, wherein the means for heating the precursor material is at least one of a resistive heater disposed proximate to the sidewall, a cartridge heater disposed within the canister, or a preheated carrier gas.

15. The apparatus of claim 1, wherein the precursor material is selected from the group consisting of tetrakis (dimethylamido) titanium (TDMAT), tertbutylimino tris(diethylamido) tantalum (TBTDET), and pentakis (ethylmethylamido) tantalum (PEMAT).

16. Apparatus for generating gas for a semiconductor processing system, comprising:

a canister having a sidewall, a top and a bottom defining an interior volume, the interior volume having an upper region and a lower region;

an inlet port and an outlet port formed through the top of the canister and in communication with the upper region; and a tube having a first end coupled to the inlet port and a second end terminating in the upper region of the canister; and an aperture formed in the second end of the tube orientated towards a sidewall of the canister.

17. The apparatus of claim 16, further comprising:

a first valve coupled to the inlet port; and a second valve coupled to the outlet port, the first and second valves fitted with mating disconnect fittings.

18. The apparatus of claim 16, wherein the aperture formed in the second end is angled from about 15 degrees to about 90 degrees relative to an axis of the canister.

19. The apparatus of claim 16, further compromising a precursor material at least partially filling the lower region of the canister.

20. The apparatus of claim 19, further comprising a liquid intermixed with the precursor material and forming a slurry, wherein the liquid is non-reactive with the precursor material, has a negligible vapor pressure relative to the precursor material, and the precursor material is insoluble therein.

21. The apparatus of claim 20, wherein the precursor material is selected from the group consisting of xenon difluoride, nickel carbonyl, tungsten hexacarbonyl, and pentakis (dimethylamido) tantalum.

22. The apparatus of claim 20, wherein the precursor material is tungsten hexacarbonyl and the liquid is diffusion pump oil.

23. The apparatus of claim 20, further comprising means for agitating the slurry.

24. The apparatus of claim 23, wherein the means for agitating is selected from the group consisting of a magnetic stirrer, a mixer, and a bubbler.

25. The apparatus of claim 16, further comprising an oil trap coupled to the outlet port.

26. The apparatus of claim 16, further comprising at least one baffle disposed within the upper region of the canister between the inlet port and the outlet port.

27. The apparatus of claim 26, wherein the at least one baffle is a plurality of baffles.

28. The apparatus of claim 27, wherein the plurality of baffles extends at least partially into the lower region of the canister.

29. The apparatus of claim 16, further comprising a means for heating the interior volume of the canister.

30. The apparatus of claim 29, wherein the means for heating the interior volume of the canister is at least one of a resistive heater disposed proximate to the sidewall, a cartridge heater disposed within the canister, or a preheated carrier gas.

31. The apparatus of claim 19, wherein the precursor material is selected from the group consisting of tetrakis (dimethylamido) titanium (TDMAT), tertbutylimino tris(diethylamido) tantalum (TBTDET), and pentakis (ethylmethylamido) tantalum (PEMAT).

32. Apparatus for generating gas for a processing system, comprising:

a canister having a sidewall, a top and a bottom defining an interior volume, the interior volume having an upper region and a lower region;

an inlet port and an outlet port formed through the top of the canister and in communication with the upper region;

a first valve coupled to the inlet port; and a second valve coupled to the outlet port, the first and second valves fitted with mating disconnect fittings for modular removal of the apparatus from a semiconductor process gas delivery system;

a tube having a first end coupled to the inlet port and a second end terminating in the upper region of the canister, wherein the second end is angled from about 15 degrees to about 90 degrees relative to a center axis of the canister; and a plurality of baffles disposed within the upper region of the canister and creating a tortuous flow path between the inlet port and the outlet port.

33. The apparatus of claim 32, further comprising solid precursor material at least partially filling the lower region of the canister;

a liquid intermixed with the solid precursor material forming a slurry, wherein the liquid is non-reactive with the solid precursor material, has a negligible vapor pressure relative to the solid precursor material, and the solid precursor material is insoluble therein;

means for heating the interior volume of the canister; and means for agitating the slurry.

34. The apparatus of claim 33, wherein the means for heating the interior volume of the canister is at least one of a resistive heater disposed proximate to the sidewall, a cartridge heater disposed within the canister, or a preheated carrier gas.

35. The apparatus of claim 34, wherein the means for agitating the slurry is selected from the group consisting of a magnetic stirrer, a mixer, and a bubbler.

36. The apparatus of claim 19, wherein the precursor material is selected from the group consisting of xenon difluoride, nickel carbonyl, tungsten hexacarbonyl, and pentakis (dimethylamido) tantalum, the semiconductor processing system, comprising:

a canister having a sidewall, a top and a bottom defining an interior volume, the interior volume having an upper region and a lower region;

an inlet port and an outlet port formed through the top of the canister and in communication with the upper region;

at least one baffle disposed within the upper region of the canister between the inlet port and the outlet port; and a solid material at least partially filling the lower region of the canister and adapted to sublimate to a gas vapor when heated to a predefined temperature at a predefined pressure.

37. The apparatus of claim 1, wherein the baffles are prefabricated to insert into the canister.

38. The apparatus of claim 1, wherein the baffles forms an extended man flow path from the upper region into the lower region of the canister.

* * * * *

UNITED STATES PATENT AND TRADEMARK OFFICE
CERTIFICATE OF CORRECTION

PATENT NO. : 7,186,385 B2  Page 1 of 1
APPLICATION NO. : 10/198727
DATED : March 6, 2007
INVENTOR(S) : Ganguli et al.

It is certified that error appears in the above-identified patent and that said Letters Patent is hereby corrected as shown below:

Column 9, Claim 19, Line 19: Change "compromising" to --comprising--

Column 10, Claim 38, Line 58: Change "forms" to --form--

Column 10, Claim 28, Line 59: Change "man" to --mean--

Signed and Sealed this

Twenty-second Day of May, 2007

JON W. DUDAS
*Director of the United States Patent and Trademark Office*